US012482386B2

(12) United States Patent
Yeo et al.

(10) Patent No.: US 12,482,386 B2
(45) Date of Patent: Nov. 25, 2025

(54) DISPLAY DEVICE

(71) Applicant: Samsung Display Co., Ltd., Yongin-si (KR)

(72) Inventors: Inhyeok Yeo, Yongin-si (KR); Kwang-Min Kim, Yongin-si (KR); Kiwook Kim, Yongin-si (KR); Do Yeon Hwang, Yongin-si (KR); Il-Joo Kim, Yongin-si (KR); Myeonghee Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/646,288

(22) Filed: Apr. 25, 2024

(65) Prior Publication Data

US 2024/0386820 A1 Nov. 21, 2024

(30) Foreign Application Priority Data

May 18, 2023 (KR) ........................ 10-2023-0064399

(51) Int. Cl.
*G09G 3/00* (2006.01)
*G09G 3/3225* (2016.01)
*H10K 59/131* (2023.01)

(52) U.S. Cl.
CPC ........... *G09G 3/006* (2013.01); *G09G 3/3225* (2013.01); *H10K 59/131* (2023.02); *G09G 2320/0233* (2013.01)

(58) Field of Classification Search
CPC ........ G09G 3/006; G09G 3/20; G09G 3/3225; G09G 2320/0233; H10K 59/131
See application file for complete search history.

(56) References Cited

U.S. PATENT DOCUMENTS

| | | | | |
|---|---|---|---|---|
| 8,742,784 B2 | 6/2014 | Kim et al. | | |
| 2011/0050660 A1* | 3/2011 | Kim | G09G 3/006 | 345/205 |
| 2019/0057632 A1* | 2/2019 | Kim | G09G 3/3266 | |
| 2020/0152881 A1* | 5/2020 | Cho | H10K 59/131 | |

FOREIGN PATENT DOCUMENTS

KR 10-1040859 B1 6/2011

* cited by examiner

*Primary Examiner* — Hang Lin

(74) *Attorney, Agent, or Firm* — Womble Bond Dickinson (US) LLP

(57) ABSTRACT

A display device includes: a display panel including a pixel connected to a scan line and a data line; a flexible printed circuit board connected to the display panel; a lightning test circuit on the flexible printed circuit board and connected to the data line; and a plurality of resistors adjacent to opposite sides of the lightning test circuit and connected to the lightning test circuit.

20 Claims, 11 Drawing Sheets

DISPLAY DEVICE

CROSS-REFERENCE TO RELATED APPLICATION

The present application claims priority to and the benefit of Korean Patent Application No. 10-2023-0064399, filed on May 18, 2023, in the Korean Intellectual Property Office, the entire disclosure of which is incorporated herein by reference.

BACKGROUND

1. Field

Aspects of some embodiments of the present disclosure described herein relate to a display device.

2. Description of the Related Art

Generally, electronic devices, which display images to users, such as smartphones, digital cameras, notebook computers, navigation systems, and smart televisions include a display device for displaying the images. The display device generates images and provides users with the generated image through a display screen.

The display device includes a plurality of pixels for displaying images, scan lines connected to the pixels, and data lines connected to the pixels. The pixels receive data voltages through the data lines in response to scan signals received through the scan lines. The pixels display images by emitting luminance corresponding to data voltages.

When manufacturing the display device, a lightning test circuit may be used to determine whether the pixels operate normally. The lightning test circuit may be connected to the data lines and applies a test signal to the pixels. The pixels are turned on in response to the test signal, and pixels that fail to be turned on or do not produce normal luminance are determined as defective pixels.

The lightning test circuit includes a plurality of transistors for switching the transmission of the test signal. The transistors may be vulnerable to external static electricity and may be damaged by the external static electricity. A technology for preventing or reducing damage to transistors of the lightning test circuit may be desirable.

The above information disclosed in this Background section is only for enhancement of understanding of the background and therefore the information discussed in this Background section does not necessarily constitute prior art.

SUMMARY

Aspects of some embodiments of the present disclosure include a display device capable of preventing or reducing damage to lightning test circuits and reducing a luminance difference of a display panel during a pixel lighting test.

According to some embodiments, a display device includes a display panel including a pixel connected to a scan line and a data line, a flexible printed circuit board connected to the display panel, a lightning test circuit on the flexible printed circuit board and connected to the data line, and a plurality of resistors adjacent to opposite sides of the lightning test circuit to be connected to the lightning test circuit.

According to some embodiments, a display device includes a display panel including a pixel connected to a scan line and a data line, a flexible printed circuit board connected to the display panel, a lightning test circuit on the flexible printed circuit board and including a transistor including a gate electrode, a first electrode, a semiconductor layer, and a second electrode connected to the data line, a first resistor adjacent to one side of the lightning test circuit to be connected to the gate electrode and the first electrode, and a second resistor adjacent to the other side of the lightning test circuit to be connected to the gate electrode and the first electrode.

BRIEF DESCRIPTION OF THE DRAWINGS

The above and other aspects and features of some embodiments of the present disclosure will become apparent by describing in more detail aspects of some embodiments thereof with reference to the accompanying drawings.

DETAILED DESCRIPTION

Figure 1:
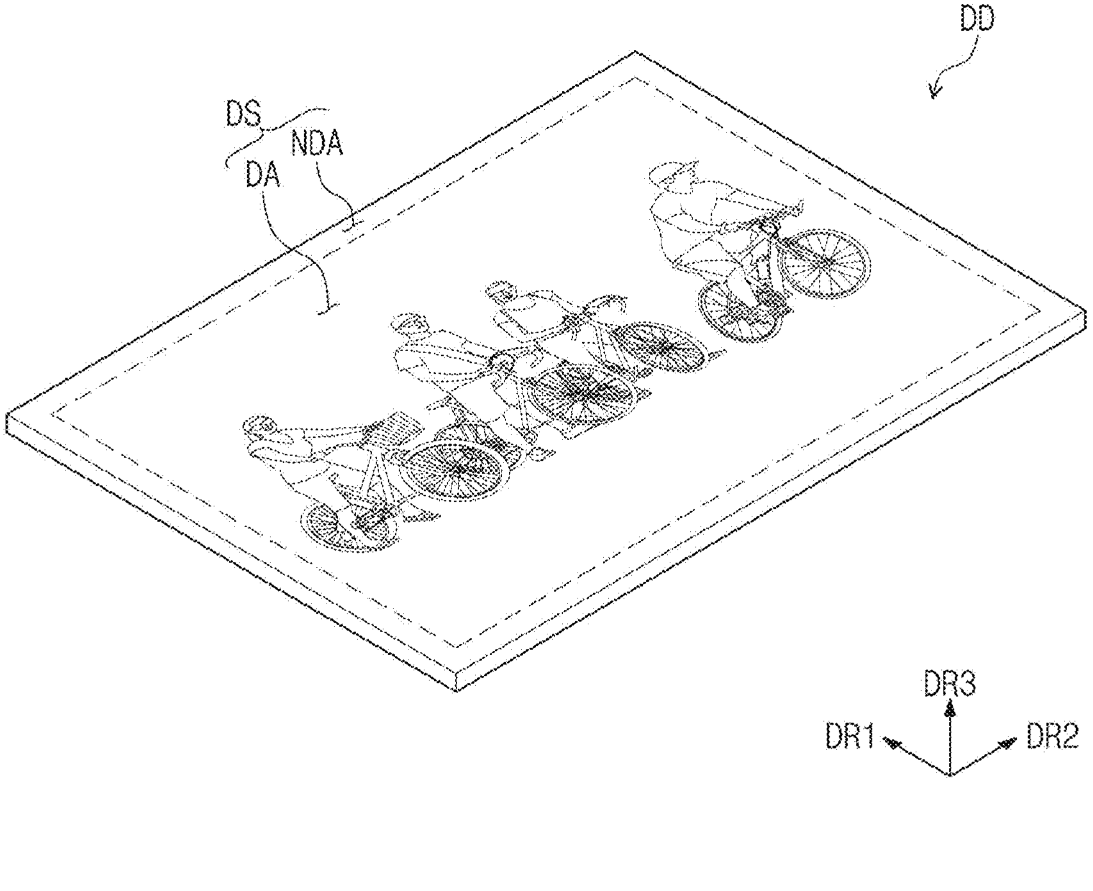
FIG. 1 is a perspective view of a display device, according to some embodiments of the present disclosure.

In the specification, when one component (or area, layer, part, or the like) is referred to as being "on", "connected to", or "coupled to" another component, it should be understood that the former may be directly on, connected to, or coupled to the latter, and also may be on, connected to, or coupled to the latter via a third intervening component.

Like reference numerals refer to like components. Also, in drawings, the thickness, ratio, and dimension of components are exaggerated for effectiveness of description of technical contents.

The term "and/or" includes one or more combinations of the associated listed items.

Although the terms "first", "second", etc. may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The articles "a," "an," and "the" are singular in that they have a single referent, but the use of the singular form in the specification should not preclude the presence of more than one referent.

Also, the terms "under", "beneath", "on", "above", etc. are used to describe a relationship between components illustrated in a drawing. The terms are relative and are described with reference to a direction indicated in the drawing.

Unless otherwise defined, all terms (including technical terms and scientific terms) used in this specification have the same meaning as commonly understood by those skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Hereinafter, embodiments of the present disclosure will be described with reference to accompanying drawings.

FIG. 1 is a perspective view of a display device, according to some embodiments of the present disclosure.

Referring to FIG. 1, a display device DD may have a plane defined by first and second directions DR1 and DR2. The display device DD may have a shape of a rectangle having short sides in the first direction DR1 and long sides in the second direction DR2. However, embodiments according to the present disclosure are not limited thereto, and the display device DD may have various shapes such as a circle or a polygon.

The top surface of the display device DD may be defined as a display surface DS, and may have a plane defined by the first direction DR1 and the second direction DR2. An image generated by the display device DD may be provided to a user through the display surface DS.

The display surface DS may include a display area DA and a non-display area NDA around the display area DA. The display area DA may display images, and the non-display area NDA may not display images. The non-display area NDA may surround the display area DA and may define a border of the display module DM printed in a color (e.g., a set or predetermined color). That is, according to some embodiments, the non-display area NDA may be located in a periphery (or outside a footprint) of the display area DA.

1 The display device DD may be used for a large electronic device such as a television, a monitor, or an outer billboard. Moreover, the display device DD may be used for small and medium electronic devices such as a personal computer, a notebook computer, a personal digital terminal, an automotive navigation system, a game console, a smartphone, a tablet, or a camera. However, the above examples are provided only for illustrative purposes, and as a person having ordinary skill in the art would appreciate, the display device DD may be applied to any other electronic device(s) without departing from the spirit and scope of embodiments according to the present disclosure.

Figure 2:
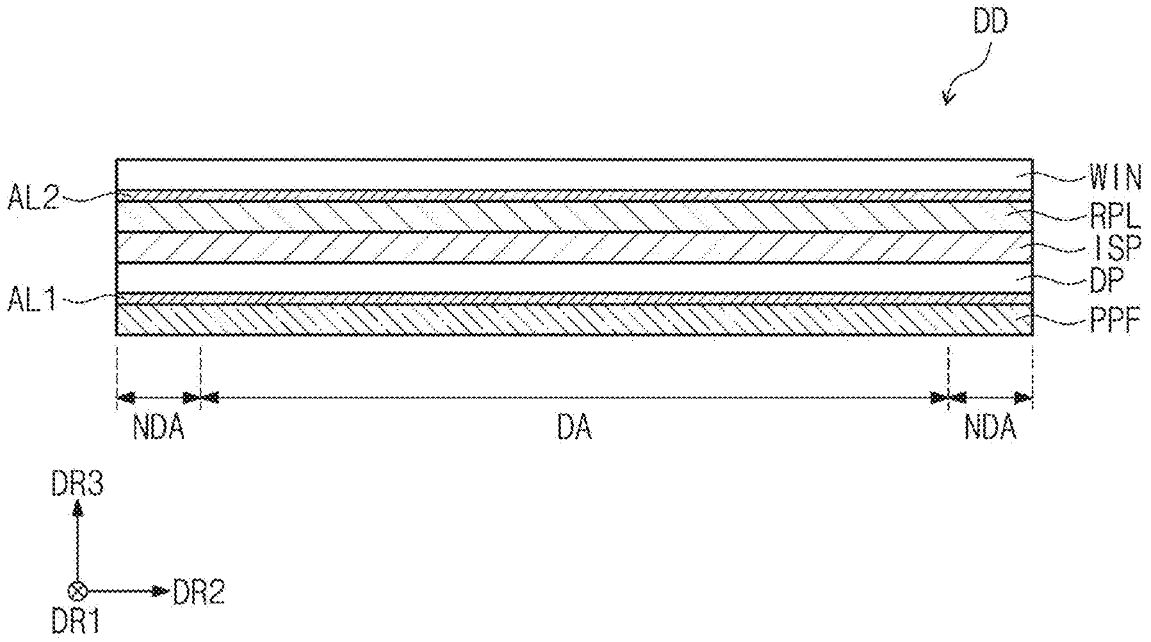
FIG. 2 is a diagram illustrating a cross-section of the display device shown in FIG. 1.

FIG. 2 is a diagram illustrating a cross-section of the display device shown in FIG. 1.

FIG. 2 illustrates a cross-section of the display device DD when viewed in the first direction DR1.

Referring to FIG. 2, the display device DD may include a display panel DP, an input sensing part ISP, an anti-reflection layer RPL, a window WIN, a panel protection film PPF, and first and second adhesive layers AL1 and AL2.

According to some embodiments of the present disclosure, the display panel DP may include a light emitting display panel. For example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot, a quantum rod, or the like. Hereinafter, it is described that the display panel DP is an organic light emitting display panel.

The input sensing part ISP may be located on the display panel DP. The input sensing part ISP may include a plurality of sensing parts for sensing an external input in a capacitive scheme. When the display device DD is manufactured, the input sensing part ISP may be directly manufactured on the display panel DP. However, embodiments according to the present disclosure are not limited thereto, and the input sensing part ISP may be manufactured as a separate panel from the display panel DP and attached to the display panel DP by an adhesive layer.

The anti-reflection layer RPL may be located on the input sensing part ISP. When the display device DD is manufactured, the anti-reflection layer RPL may be directly manufactured on the input sensing part ISP. However, embodiments according to the present disclosure are not limited thereto, and the anti-reflection layer RPL may be manufactured as a separate panel and attached to the input sensing part ISP by an adhesive layer.

The anti-reflection layer RPL may be defined as an external light anti-reflection film. The anti-reflection layer RPL may reduce the reflectance of external light incident from the top surface of the display device DD toward the display panel DP. The external light may not be perceived to a user by the anti-reflection layer RPL.

When external light directed toward the display panel DP is reflected from the display panel DP and provided again to an external user, the user may visually perceive the external light, like a mirror. To prevent or reduce this phenomenon, the anti-reflection layer RPL may include a plurality of color filters for displaying the same color as the pixels of the display panel DP.

The color filters may filter the external light to the same color as pixels. In this case, the external light may not be perceived by the user. However, embodiments according to the present disclosure are not limited thereto, and the anti-reflection layer RPL may include a phase retarder and/or a polarizer to reduce the reflectance of external light.

The window WIN may be located on the anti-reflection layer RPL. The window WIN may protect the display panel DP, the input sensing part ISP, and the anti-reflection layer RPL from external scratches and impacts.

The panel protection film PPF may be located under the display panel DP. The panel protection film PPF may protect a bottom surface of the display panel DP. The panel protection film PPF may include a flexible plastic material such as Polyethyleneterephthalate (PET).

The first adhesive layer AL1 may be interposed between the display panel DP and the panel protection film PPF, and the display panel DP and the panel protection film PPF may be bonded to each other by the first adhesive layer AL1. The second adhesive layer AL2 may be interposed between the window WIN and the anti-reflection layer RPL, and the window WIN and the anti-reflection layer RPL may be bonded to each other by the second adhesive layer AL2.

Figure 3:
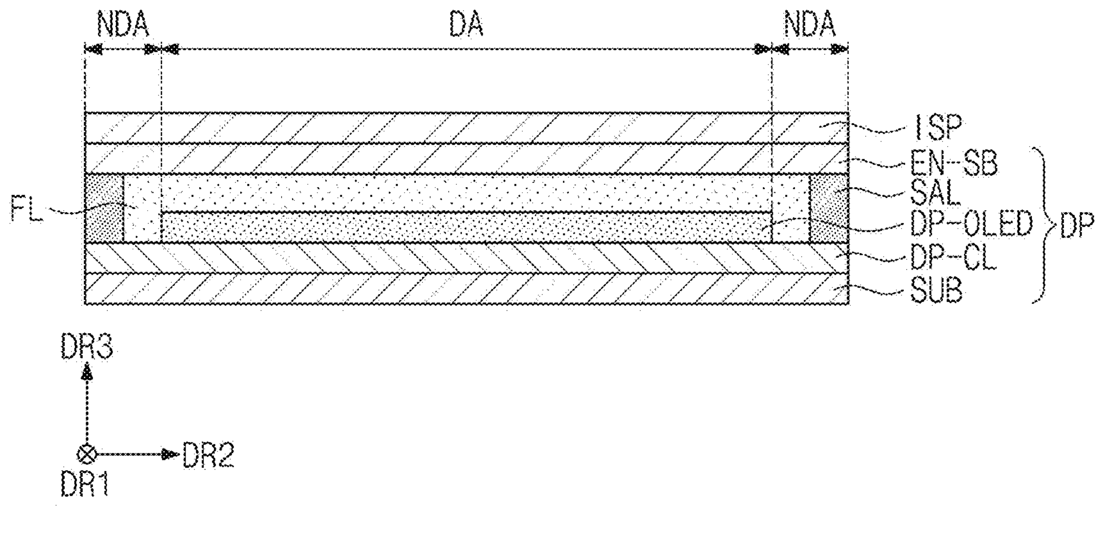
FIG. 3 is a diagram illustrating a cross-section of the display panel shown in FIG. 2.

FIG. 3 is a diagram illustrating a cross-section of the display panel shown in FIG. 2.

FIG. 3 shows a cross section of the display panel DP when viewed in the first direction DR1, and shows the input sensing part ISP together with the display panel DP.

Referring to FIG. 3, the display panel DP may include a substrate SUB, a circuit element layer DP-CL, a display element layer DP-OLED, an encapsulation substrate EN-SB, a sealing layer SAL, and a filler FL. The circuit element layer DP-CL may be located on the substrate SUB. The display element layer DP-OLED may be located on the circuit element layer DP-CL.

A plurality of pixels may be located on the circuit element layer DP-CL and the display element layer DP-OLED. Each of the pixels may include a transistor located on the circuit element layer DP-CL and a light emitting element located on the display element layer DP-OLED and connected to a transistor.

The substrate SUB may include the display area DA and the non-display area NDA around the display area DA. The display element layer DP-OLED may be located in the display area DA. The encapsulation substrate EN-SB may be located on the display element layer DP-OLED. Each of the substrate SUB and the encapsulation substrate EN-SB may be of a rigid type. According to this structure, the display panel DP may be of a rigid type.

The sealing layer SAL may be interposed between the substrate SUB and the encapsulation substrate EN-SB. The sealing layer SAL may be located on the non-display area NDA. The sealing layer SAL may bond the substrate SUB and the encapsulation substrate EN-SB. The display element layer DP-OLED may be sealed between the substrate SUB and the encapsulation substrate EN-SB by the sealing layer SAL. The sealing layer SAL may include a photocurable material.

The filler FL may be interposed between the substrate SUB and the encapsulation substrate EN-SB. The filler FL may be placed in a space sealed by the sealing layer SAL between the substrate SUB and the encapsulation substrate EN-SB. The filler FL may include a thermosetting material.

The input sensing part ISP may be directly located on the display panel DP. For example, the input sensing part ISP may be located directly on the encapsulation substrate EN-SB.

Figure 4:
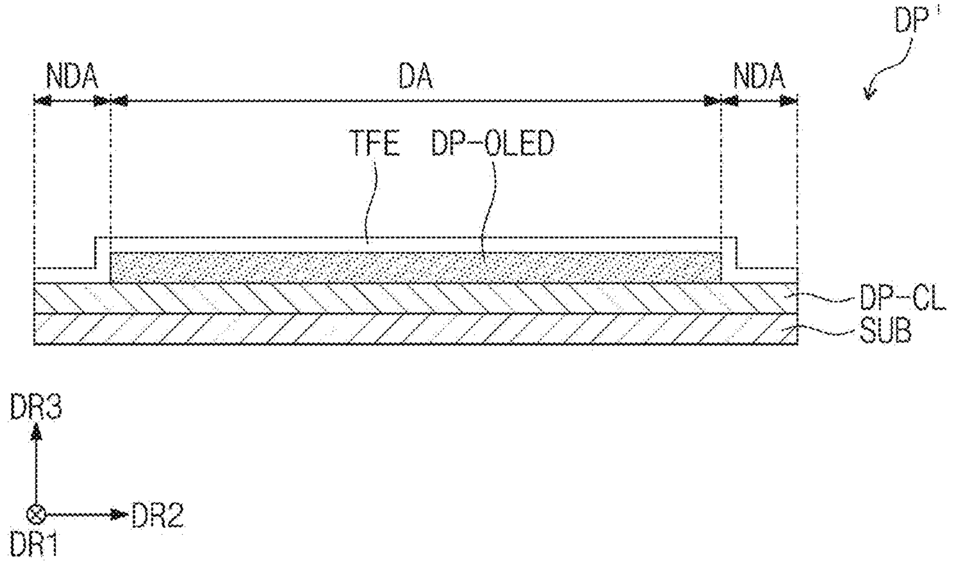
FIG. 4 is a view showing a cross section of a display panel according to some embodiments of the present disclosure.

FIG. 4 is a view showing a cross section of a display panel according to some embodiments of the present disclosure.

Referring to FIG. 4, the display panel DP may include the circuit element layer DP-CL located on the substrate SUB, the display element layer DP-OLED located on the circuit element layer DP-CL, and a thin film encapsulation layer TFE located on the display element layer DP-OLED.

The display panel DP may be a flexible display panel. For example, the substrate SUB may include a flexible plastic material such as polyimide. An arrangement structure of the circuit element layer DP-CL and the display element layer DP-OLED may be the same as that of the circuit element layer DP-CL and the display element layer DP-OLED shown in FIG. 3.

The thin film encapsulation layer TFE may be located on the circuit element layer DP-CL so as to cover the display element layer DP-OLED. The thin film encapsulation layer TFE may include inorganic layers and an organic layer between the inorganic layers. The inorganic layers may protect pixels from moisture/oxygen.

The organic layer may protect the pixels from foreign substances such as dust particles. According to some embodiments, the input sensing part ISP shown in FIG. 2 may be directly located on the thin film encapsulation layer TFE.

Figure 5:
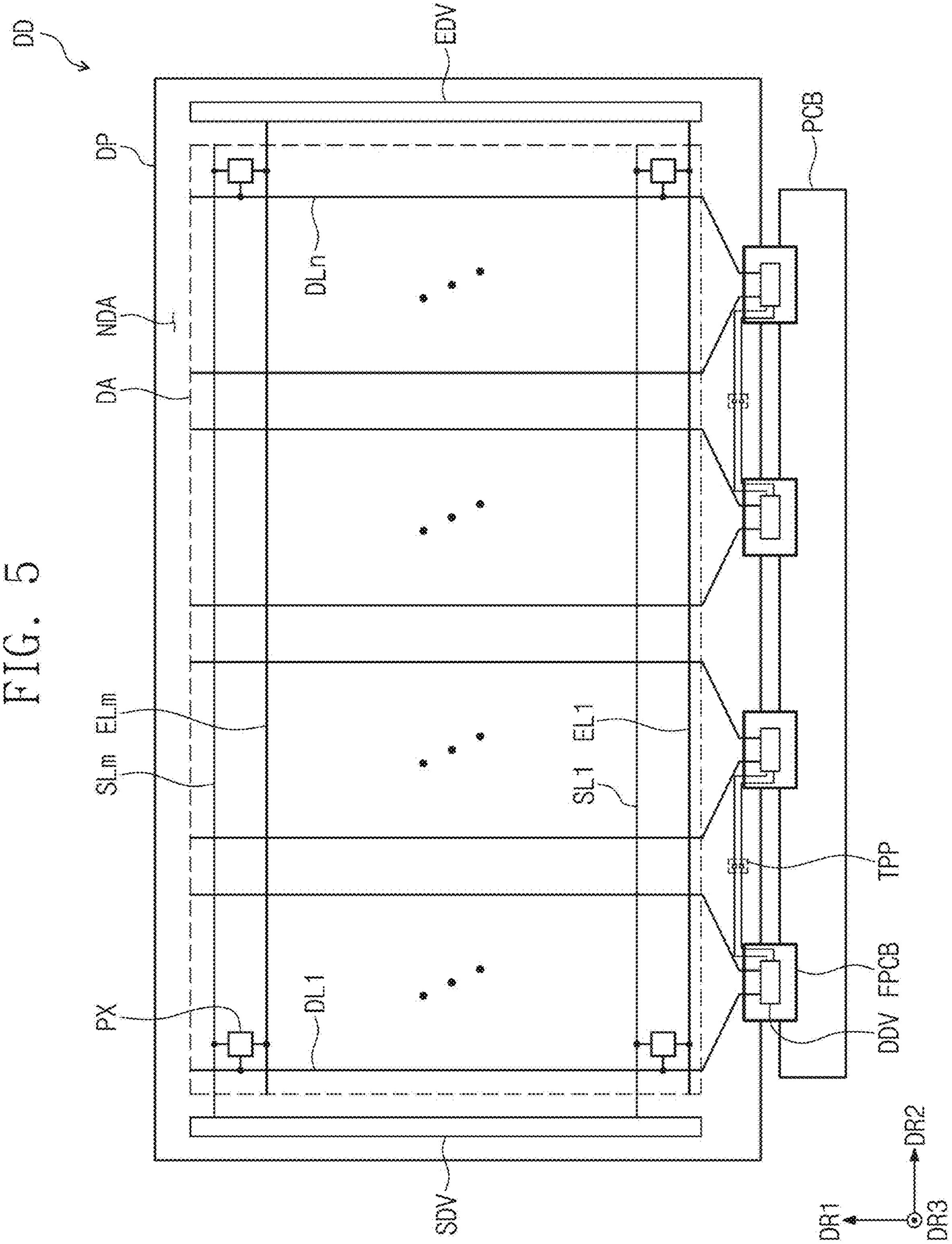
FIG. 5 is a plan view of the display panel shown in FIG. 2.

FIG. 5 is a plan view of the display panel shown in FIG. 2.

Referring to FIG. 5, the display device DD may include the display panel DP, a scan driver SDV, a plurality of data drivers DDV, a plurality of flexible printed circuit boards FPCB, an emission driver EDV, and a printed circuit board PCB.

The display panel DP may include the display area DA and the non-display area NDA surrounding the display area DA. The display area DA and the non-display area NDA of the display panel DP may respectively correspond to the display area DA and the non-display area NDA shown in FIG. 2.

The display panel DP may have a rectangular shape having short sides extending in the first direction DR1 and long sides extending in the second direction DR2. However, the shape of the display panel DP is not limited thereto.

The display panel DP may include a plurality of pixels PX, a plurality of scan lines SL1 to SLm, a plurality of data lines DL1 to DLn, and a plurality of emission lines EL1 to ELm. Each of 'm' and 'n' is a natural number.

The pixels PX may be positioned in the display area DA. The scan driver SDV and the emission driver EDV may be located in the non-display area NDA adjacent to the short sides of the display panel DP.

The pixels PX may include a plurality of first pixels, a plurality of second pixels, and a plurality of third pixels. The first pixels may display red, the second pixels may display green, and the third pixels may display blue.

When viewed from above a plane, the data drivers DDV may be positioned adjacent to a lower side of the display panel DP, which is defined as one of long sides of the display panel DP. When viewed from above a plane defined by the first direction DR1 and the second direction DR2 (e.g., when viewed in a plan view), the printed circuit board PCB may be positioned adjacent to the lower side of the display panel DP.

The flexible printed circuit board FPCB may be connected between the lower side of the display panel DP and the printed circuit board PCB. The data drivers DDV may be manufactured as integrated circuit chips and may be mounted on the flexible printed circuit boards FPCB, respectively. For example, the four flexible printed circuit boards FPCB and the four data drivers DDV are shown, but the number of flexible printed circuit boards FPCB and the number of the data drivers DDV are not limited thereto.

The scan lines SL1 to SLm may extend in the second direction DR2 so as to be connected to the pixels PX and the scan driver SDV. The emission lines EL1 to ELm may extend in the second direction DR2 so as to be connected to pixels PX and the emission driver EDV.

The data lines DL1 to DLn may extend in the first direction DR1 so as to be connected to the pixels PX and the data drivers DDV. A plurality of data lines may be connected to each of the data drivers DDV.

According to some embodiments, the display device DD may further include a timing controller for controlling operations of the scan driver SDV, the data drivers DDV, and the emission driver EDV. The timing controller may be manufactured in a form of an integrated circuit chip and mounted on the printed circuit board PCB. The timing controller may be connected to the data drivers DDV, the scan driver SDV, and the emission driver EDV through the printed circuit board PCB and the flexible printed circuit board FPCB.

The display device DD may include a plurality of test pad parts TPP located on the display panel DP. Each of the test pad parts TPP may be located on an area of the display panel DP between a pair of the corresponding flexible printed circuit boards FPCB among the flexible printed circuit boards FPCB. Each of the test pad parts TPP may be connected to lightning test parts (shown in FIGS. 7A and 7B below) located on a pair of the corresponding flexible printed circuit boards FPCB. This configuration will be described in detail with reference to FIGS. 7A and 7B below.

The scan driver SDV may generate a plurality of scan signals. The scan signals may be applied to the pixels PX through the scan lines SL1 to SLm. The data drivers DDV may generate a plurality of data voltages. The data voltages may be applied to the pixels PX through the data lines DL1 to DLn. The emission driver EDV may generate a plurality of emission signals. The emission signals may be applied to the pixels PX through the emission lines EL1 to ELm.

The pixels PX may receive the data voltages in response to the scan signals. The pixels PX may display an image by emitting light of luminance corresponding to the data voltages in response to the emission signals. The emission time of the pixels PX may be controlled by the emission signals.

Figure 6:
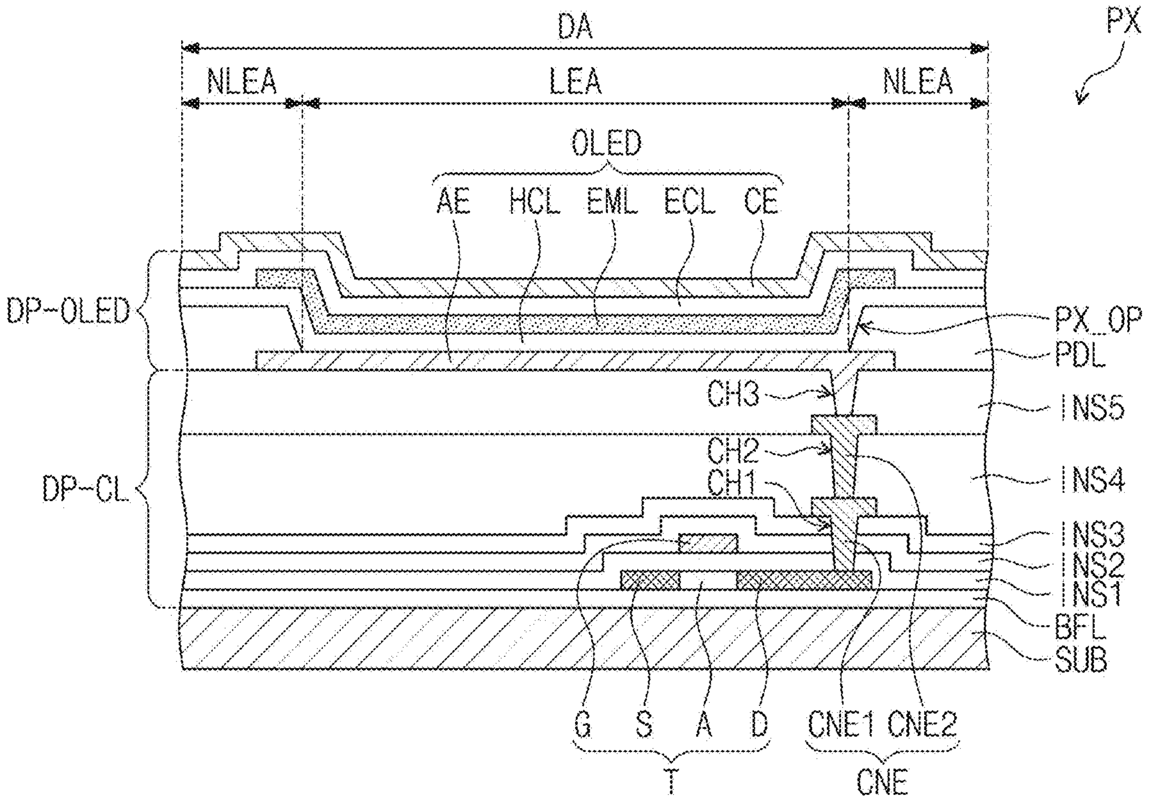
FIG. 6 is a cross-sectional view of a light emitting element and a transistor of a pixel shown in FIG. 5.

FIG. 6 is a cross-sectional view of a light emitting element and a transistor of a pixel shown in FIG. 5.

Referring to FIG. 6, a light emitting element OLED may include a first electrode AE, a second electrode CE, a hole control layer HCL, an electron control layer ECL, and a light emitting layer EML. The first electrode AE may be an anode, and the second electrode CE may be a cathode. The second electrode CE may be located on the first electrode AE. The hole control layer HCL, the electron control layer ECL, and the light emitting layer EML may be interposed between the first electrode AE and the second electrode CE.

A transistor T and the light emitting element OLED may be located on the substrate SUB. The display area DA may include an emission area LEA corresponding to the pixel PX and a non-emission area NLEA adjacent to the emission area LEA. The light emitting element OLED may be positioned in the emission area LEA.

A buffer layer BFL may be located on the substrate SUB, and the buffer layer BFL may be an inorganic layer. Semiconductor layers S, A, and D of the transistor T may be located on the buffer layer BFL. The semiconductor layers S, A, and D may include polysilicon. However, it is not limited thereto, and the semiconductor layers S, A, and D may include amorphous silicon.

The semiconductor layers S, A, and D may be doped with an N-type dopant or a P-type dopant. The semiconductor layers S, A, and D may include a highly-doped area and a lightly-doped area. Conductivity of the highly-doped area (e.g., a source area and a drain area) may be greater than that of the lightly-doped area. The highly-doped area may substantially operate as a source electrode or a drain electrode of the transistor T. The lightly-doped area may substantially correspond to a channel area (or channel) of the transistor T.

The source area S, the channel area A, and the drain area D of the transistor T may be formed from the semiconductor layers S, A, and D. The channel area A may be interposed between the source area S and the drain area D.

A first insulating layer INS1 may be located on the buffer layer BFL to cover the semiconductor layers S, A, and D. The gate electrode G (or control electrode) of the transistor T may be located on the first insulating layer INS1.

According to some embodiments, the pixel PX may further include a plurality of transistors and a capacitor in addition to the transistor T shown in FIG. 6.

A second insulating layer INS2 may be located on the first insulating layer INS1 to cover the gate electrode G. A third insulating layer INS3 may be located on the second insulating layer INS2. The buffer layer BFL and the first to third insulating layers INS1 to INS3 may include inorganic layers.

A connection electrode CNE may be interposed between the transistor T and the light emitting element OLED. The connection electrode CNE may electrically connect the transistor T and the light emitting element OLED. The connection electrode CNE may include a first connection electrode CNE1 and a second connection electrode CNE2 located on the first connection electrode CNE1.

The first connection electrode CNE1 may be located on the third insulating layer INS3 and may be connected to the drain area D through a first contact hole CH1 defined in the first to third insulating layers INS1 to INS3. A fourth insulating layer INS4 may be located on the third insulating layer INS3 to cover the first connection electrode CNE1.

The second connection electrode CNE2 may be located on the fourth insulating layer INS4. The second connection electrode CNE2 may be connected to the first connection electrode CNE1 through a second contact hole CH2 defined in the fourth insulating layer INS4. A fifth insulating layer INS5 may be located on the fourth insulating layer INS4 to cover the second connection electrode CNE2. The fourth and fifth insulating layers INS4 and INS5 may include an inorganic layer or an organic layer.

The first electrode AE may be located on the fifth insulating layer INS5. The first electrode AE may be electrically connected to the second connection electrode CNE2 through a third contact hole CH3 defined in the fifth insulating layer INS5.

A pixel defining layer PDL exposing a portion (e.g., a set or predetermined portion) of the first electrode AE may be located on the first electrode AE and the fifth insulating layer INS5. An opening PX_OP for exposing a portion (e.g., a set or predetermined portion) of the first electrode AE may be defined in the pixel defining layer PDL.

The hole control layer HCL may be located on the first electrode AE and the pixel defining layer PDL. The hole control layer HCL may be located in common in the emission area LEA and the non-emission area NLEA. The hole control layer HCL may include a hole transport layer and a hole injection layer.

The light emitting layer EML may be located on the hole control layer HCL. The light emitting layer EML may be located in an area corresponding to an opening PX_OP. The light emitting layer EML may include an organic material and/or an inorganic material. The light emitting layer EML may generate one of red light, green light, and blue light.

The electron control layer ECL may be located on the light emitting layer EML and the hole control layer HCL. The electron control layer ECL may be located in common in the emission area LEA and the non-emission area NLEA. The electron control layer ECL may include an electron transport layer and an electron injection layer.

The second electrode CE may be located on the electron control layer ECL. The second electrode CE may be located in the pixels PX in common. That is, the second electrode CE may be commonly located on the light emitting layers EML of the pixels PX.

Layers from the buffer layer BFL to the fifth insulating layer INS5 may be defined as the circuit element layer DP-CL. A layer on which the light emitting element OLED is located may be defined as the display element layer DP-OLED.

A first voltage may be applied to the first electrode AE, and a second voltage having a lower level than the first voltage may be applied to the second electrode CE. Excitons may be formed by coupling holes and electrons injected into the light emitting layer EML. As the excitons transition to a ground state, the light emitting element OLED may emit light. The light emitting element OLED may emit light to display an image.

Figure 7A:
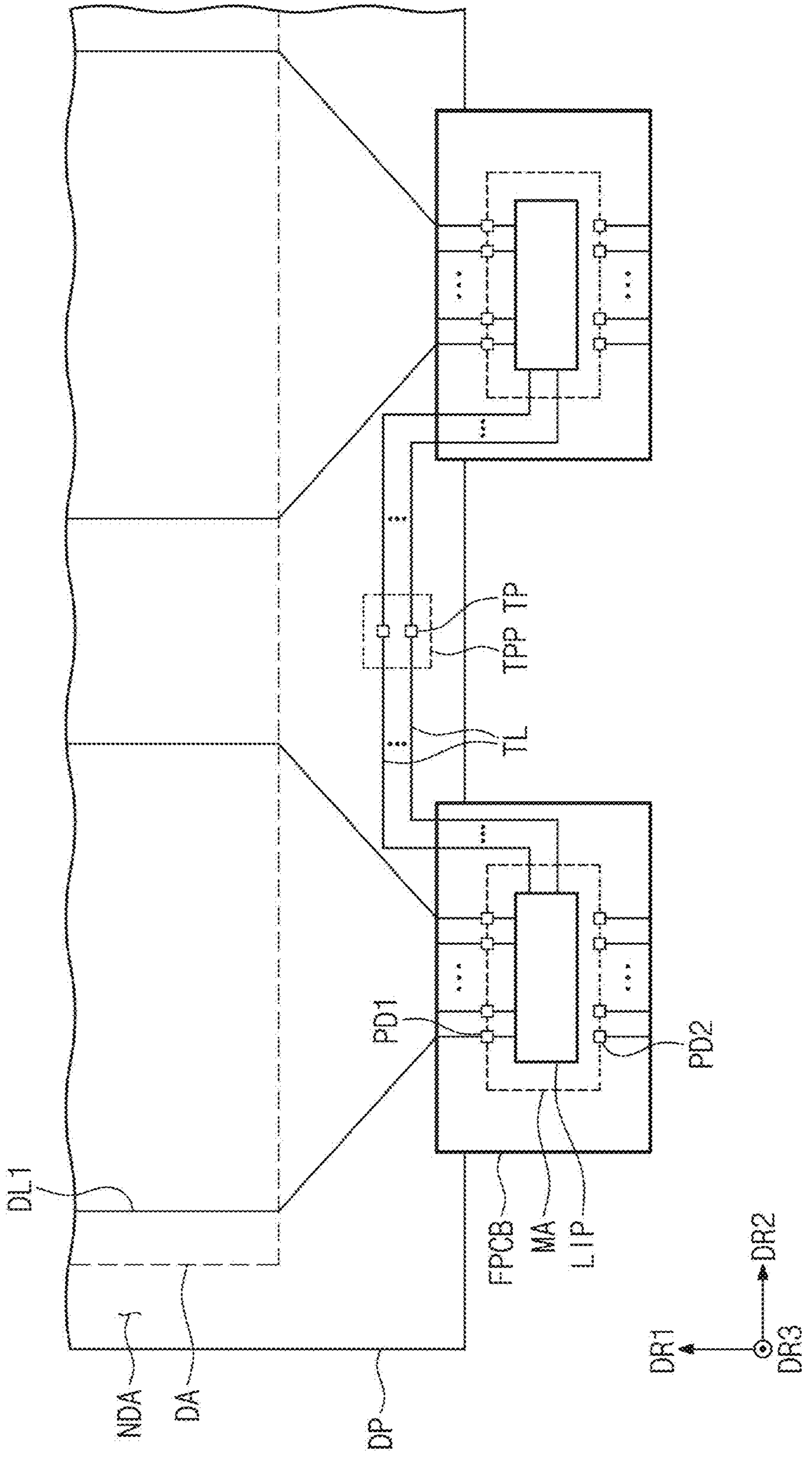
FIGS. 7A and 7B are enlarged views of flexible printed circuit boards shown in FIG. 5 from which data drivers are removed.
Figure 7B:
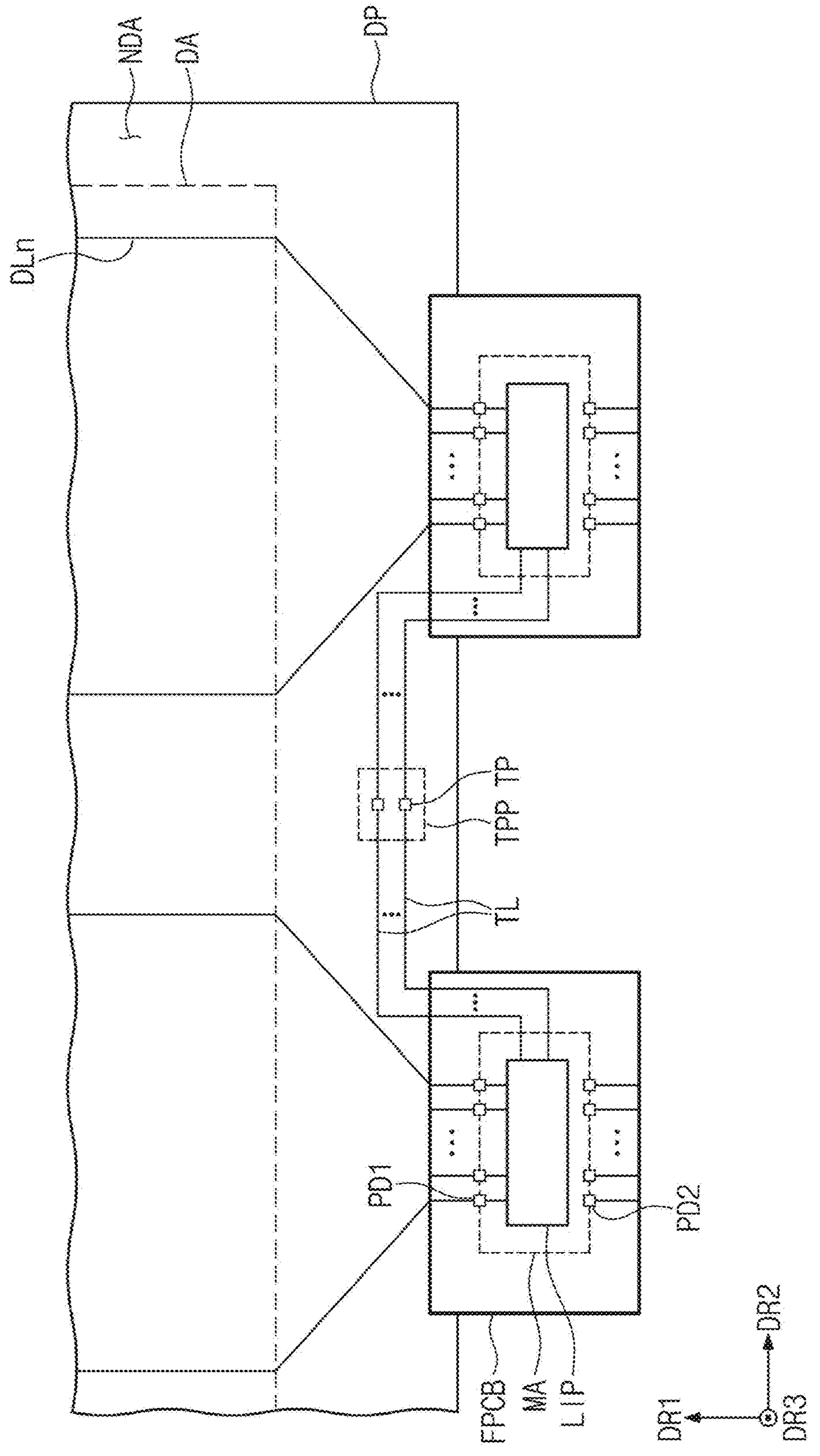

FIGS. 7A and 7B are enlarged views of flexible printed circuit boards shown in FIG. 5 from which data drivers are removed.

For example, FIGS. 7A and 7B also show a portion of the display panel DP connected to the flexible printed circuit boards FPCB. For convenience of description, the pixels PX connected to the data lines DL1 to DLn are omitted in FIGS. 7A and 7B.

FIG. 7A is a diagram showing the left flexible printed circuit boards FPCB with respect to the center of the display panel DP. FIG. 7B is a diagram showing the right flexible printed circuit boards FPCB with respect to the center of the display panel DP.

Referring to FIGS. 7A and 7B, a plurality of mounting areas MA may be defined on the flexible printed circuit boards FPCB, respectively. The mounting areas MA may be defined as areas where the data drivers DDV shown in FIG. 5 are mounted. The mounting areas MA may have a shape corresponding to the data drivers DDV. For example, each of the mounting areas MA may have a rectangular shape to correspond to each of the data drivers DDV having a rectangular shape.

A plurality of first pads PD1 and a plurality of second pads PD2 may be located on each of the flexible printed circuit boards FPCB. The first pads PD1 and the second pads PD2 may be located on opposite sides of each of the mounting areas MA in the first direction DR1. The first pads PD1 and the second pads PD2 may be located on opposite sides of each of the mounting areas MA extending in the second direction DR2.

The first pads PD1 and the second pads PD2 may be spaced from each other in the first direction DR1. The first pads PD1 may be arranged in the second direction DR2. The second pads PD2 may be arranged in the second direction DR2. The first pads PD1 may be more adjacent to the display panel DP than the second pads PD2.

The data drivers DDV may be connected to the first pads PD1 and the second pads PD2 on the mounting areas MA. The first pads PD1 may be connected to the data lines DL1 to DLn. The second pads PD2 may be connected to the printed circuit board PCB shown in FIG. 5.

Pieces of image data output from a timing controller of the printed circuit board PCB may be provided to the data drivers DDV through the second pads PD2. The data drivers DDV may generate data voltages by using video signals. The data voltages may be applied to the data lines DL1 to DLn through the first pads PD1.

The display device DD may include a plurality of lightning test parts LIP respectively located on the flexible printed circuit boards FPCB. The lightning test parts LIP may be connected to the first pads PD1 and not connected to the second pads PD2. When the data drivers DDV shown in FIG. 5 are removed, the lightning test parts LIP may be exposed to the outside. That is, the lightning test parts LIP may be located under (or substantially under) the data drivers DDV, respectively.

Before the data drivers DDV are respectively mounted on the mounting areas MA, the lightning test parts LIP may be used to test the pixels PX. The lightning test parts LIP may apply test signals for testing operating states of the pixels PX to the pixels PX. The test signals may be provided to the pixels PX by being applied to the data lines DL1 to DLn through the first pads PD1.

In response to the test signals, the pixels PX may be driven to generate light. In response to the test signals, whether the pixels PX are defective may be tested by identifying lighting states of the pixels PX.

Each of the test pad parts TPP may be placed on the display panel DP, and may be commonly connected to the lightning test parts LIP located on a pair of the corresponding flexible printed circuit boards FPCB. Each of the test pad parts TPP may include a plurality of test pads TP.

The test pad parts TP of each of the test pad parts TPP may be commonly connected to a pair of the corresponding lightning test parts LIP. The test pads TP and the lightning test parts LIP may be connected through test lines TL. The test lines TL may be connected to the lightning test parts LIP on the flexible printed circuit boards FPCB, may extend to the display panel DP, and may be connected to the test pads TP.

Configurations of the lightning test parts LIP are the same as one another, and thus the configuration of one lightning test part LIP will be described below.

Figure 8:
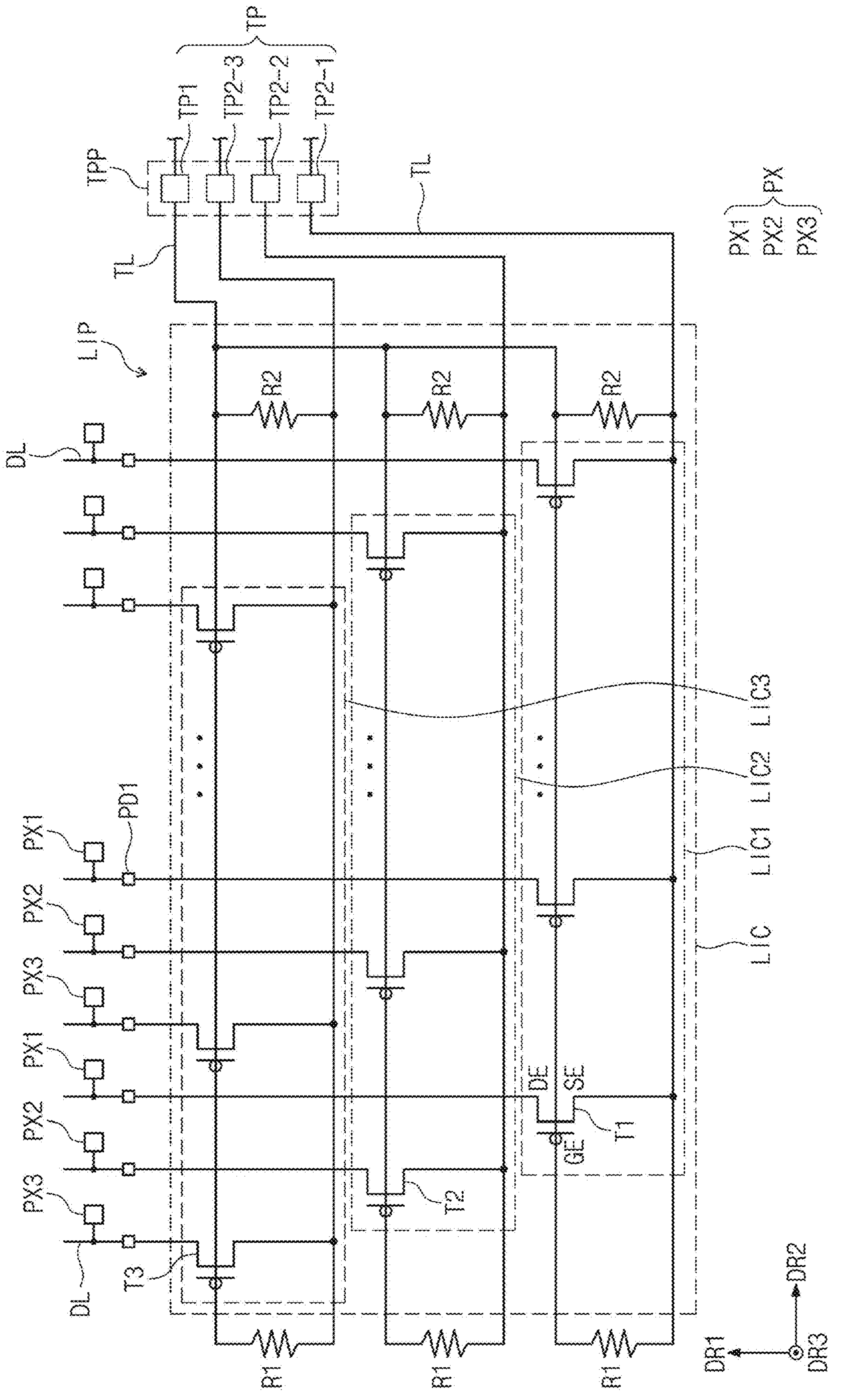
FIG. 8 is a diagram showing a configuration of a lightning test part located on the left flexible printed circuit board shown in FIG. 7A.

FIG. 8 is a diagram showing a configuration of a lightning test part located on the left flexible printed circuit board shown in FIG. 7A.

For example, FIG. 8 shows data lines by using a single mark "DL" to simply show a mark.

Referring to FIGS. 7A and 8, the lightning test part LIP may include a lightning test circuit LIC and a plurality of the resistors R1 and R2, which are located on the corresponding flexible printed circuit board FPCB. The lightning test circuit LIC may be connected to the data lines DL. For example, the lightning test circuit LIC may be connected to the data lines DL by being connected to the first pads PD1. The lightning test circuit LIC may not be connected to the second pads PD2 shown in FIG. 5.

The resistors R1 and R2 may be placed adjacent to opposite sides of the lightning test circuit LIC to be connected to the lightning test circuit LIC. The opposite sides of the lightning test circuit LIC may be opposite to each other in the second direction DR2.

The lightning test circuit LIC may include a first lightning test circuit LIC1, a second lightning test circuit LIC2, and a third lightning test circuit LIC3. The resistors R1 and R2 may include the plurality of first resistors R1 adjacent to one side of the lightning test circuit LIC, and the plurality of second resistors R2 adjacent to the other side of the lightning test circuit LIC.

The first lightning test circuit LIC1 may be connected to the first pixels PX1 among the pixels PX through the data lines DL. The second lightning test circuit LIC2 may be connected to the second pixels PX2 among the pixels PX through the data lines DL. The third lightning test circuit LIC3 may be connected to the third pixels PX3 among the pixels PX through the data lines DL.

The first, second, and third lightning test circuits LIC1, LIC2, and LIC3 may be connected to the data lines DL by being connected to the first pads PD1. The first, second, and third lightning test circuits LIC1, LIC2, and LIC3 may not be connected to the second pads PD2 shown in FIG. 5.

The test pads TP of the test pad part TPP may include a first test pad TP1 and a plurality of second test pads TP2-1, TP2-2, and TP2-3. The first test pad TP1 and the plurality of second test pads TP2-1, TP2-2, and TP2-3 may be placed on the display panel DP shown in FIG. 7A. The first test pad TP1 and the plurality of second test pads TP2-1, TP2-2, and TP2-3 may be connected to the first, second, and third lightning test circuits LIC1, LIC2, and LIC3 through the test lines TL.

The first test pad TP1 may be commonly connected to the first, second, and third lightning test circuits LIC1, LIC2, and LIC3. A control signal may be applied to the first, second, and third lightning test circuits LIC1, LIC2, and LIC3 through the first test pad TP1. The first, second, and third lightning test circuits LIC1, LIC2, and LIC3 may be turned on in response to the control signal received through the first test pad TP1.

The second test pad TP2-1 may be connected to the first lightning test circuit LIC1. The second test pad TP2-2 may be connected to the second lightning test circuit LIC2. The second test pad TP2-3 may be connected to the third lightning test circuit LIC3.

Through the second test pads TP2-1, TP2-2, and TP2-3, the test signals may be applied to the first, second, and third lightning test circuits LIC1, LIC2, and LIC3, respectively. The first lightning test circuit LIC1 may provide the test signal to the first pixels PX1 through the data lines DL. The second lightning test circuit LIC2 may provide the test signal to the second pixels PX2 through the data lines DL. The third lightning test circuit LIC3 may provide the test signal to the third pixels PX3 through the data lines DL.

The first resistors R1 may be adjacent to sides of the first, second, and third lightning test circuits LIC1, LIC2, and LIC3, respectively. The second resistors R2 may be adjacent to the other sides of the first, second, and third lightning test circuits LIC1, LIC2, and LIC3, respectively.

A pair of the first resistor R1 and the second resistor R2 may be located adjacent to opposite sides of the first lightning test circuit LIC1, which are opposite to each other in the second direction DR2. Another pair of the first resistor R1 and the second resistor R2 may be located adjacent to opposite sides of the second lightning test circuit LIC2, which are opposite to each other in the second direction DR2. Another pair of the first resistor R1 and the second resistor R2 may be located adjacent to opposite sides of the third lightning test circuit LIC3, which are opposite to each other in the second direction DR2.

The first, second, and third lightning test circuits LIC1, LIC2, and LIC3 may include a plurality of transistors T1, T2, and T3, respectively. The first lightning test circuit LIC1 may include the plurality of first transistors T1; the second lightning test circuit LIC2 may include the plurality of second transistors T2; and, the third lightning test circuit LIC3 may include the plurality of third transistors T3. The first, second, and third transistors T1, T2, and T3 may be PMOS transistors, but are not limited thereto. For example, the first, second, and third transistors T1, T2, and T3 may be NMOS transistors.

Configurations of the first, second, and third lightning test circuits LIC1, LIC2, and LIC3 are substantially the same as one another. Accordingly, a configuration of the first lightning test circuit LIC1 and the first and second resistors R1 and R2 connected to the first lightning test circuit LIC1 will be mainly described below.

Each of the first transistors T1 may include a gate electrode GE (or a control electrode), a first electrode SE (or source electrode), a second electrode DE (or drain electrode), and a semiconductor layer. The semiconductor layer may correspond to the semiconductor layers S, A, and D shown in FIG. 6.

The first and second resistors R1 and R2 may be connected to the gate electrodes GE and the first electrodes SE of the first transistors T1. In detail, the first and second resistors R1 and R2 may be adjacent to opposite sides of the first lightning test circuit LIC1 to be connected in common to the gate electrodes GE and the first electrodes SE of the first transistors T1.

The first resistor R1 may be adjacent to one side of the first lightning test circuit LIC1 to be connected to the first transistors T1. The second resistor R2 may be adjacent to the other side of the first lightning test circuit LIC1 to be connected to the first transistors T1.

The second electrodes DE of the first transistors T1 may be connected to the corresponding data lines DL, respectively. For example, the second electrodes DE of the first transistors T1 may be connected to the data lines DL connected to the first pixels PX1.

The first and second resistors R1 and R2 may be implemented with a high-resistance polysilicon semiconductor or the like. For example, the first and second resistors R1 and R2 may include the same material as the semiconductor layer of each of the first transistors T1, and may be located on the same layer as the semiconductor layer of each of the first transistors T1.

Gate electrodes and first electrodes of the second transistors T2 may also be connected to the corresponding first resistor R1 and the corresponding second resistor R2. The second electrodes of the second transistors T2 may be connected to the data lines DL connected to the second pixels PX2.

Gate electrodes and first electrodes of the third transistors T3 may be connected to the corresponding first resistor R1 and the corresponding second resistor R2. The second electrodes of the third transistors T3 may be connected to the data lines DL connected to the third pixels PX3.

The gate electrodes GE of the first transistors T1 may be connected to the first test pad TP1. The first electrodes SE of the first transistors T1 may be commonly connected to the corresponding second test pad TP2-1 among the second test pads TP2-1, TP2-2, and TP2-3. The first transistors T1 may receive a control signal through the first test pad TP1 and may receive a test signal through the second test pad TP2-1.

The first transistors T1 may be turned on in response to the control signal received through the first test pad TP1. The first transistors T1 thus turned on may provide the test signal received through the second test pad TP2-1 to the first pixels PX1. The first transistors T1 may be turned on during the lighting test of the first pixels PX1 to provide the test signal to the first pixels PX1. Accordingly, whether the first pixels PX1 are lit may be tested.

The gate electrodes of the second transistors T2 may be connected to the first test pad TP1, and the first electrodes of the second transistors T2 may be connected to the corresponding second test pad TP2-2. The gate electrodes of the third transistors T3 may be connected to the first test pad TP1, and the first electrodes of the third transistors T3 may be connected to the corresponding second test pad TP2-3.

The second and third transistors T2 and T3 may be turned on in response to a control signal received through the first test pad TP1. The second and third transistors T2 and T3 may provide the second and third pixels PX2 and PX3 with test signals received through the second test pads TP2-2 and TP2-3. Accordingly, whether the second and third pixels PX2 and PX3 are lit may be tested.

After the pixels PX are tested, the first, second, and third transistors T1, T2, and T3 may be turned off. Afterward, the data drivers DDV may be mounted on the flexible printed circuit boards FPCB, and the pixels PX may display an image in a display mode. In the display mode, the transistors T1, T2, and T3 may be turned off.

The transistors T1, T2, and T3 defined as elements of the lightning test circuit LIC may be vulnerable to static electricity. When external static electricity flows into the lightning test circuit LIC, the transistors T1, T2, and T3 may be damaged. The static electricity may be defined as a rapid flow of current. According to some embodiments of the present disclosure, when the static electricity enters the lightning test circuit LIC, the first and second resistors R1 and R2 may block rapid current flow. That is, the first and second resistors R1 and R2 may serve to dissipate the static electricity. Accordingly, the damage to the transistors T1, T2, and T3 of the lightning test circuit LIC may be prevented or reduced by preventing or reducing static electricity through the first and second resistors R1 and R2.

Figure 9:
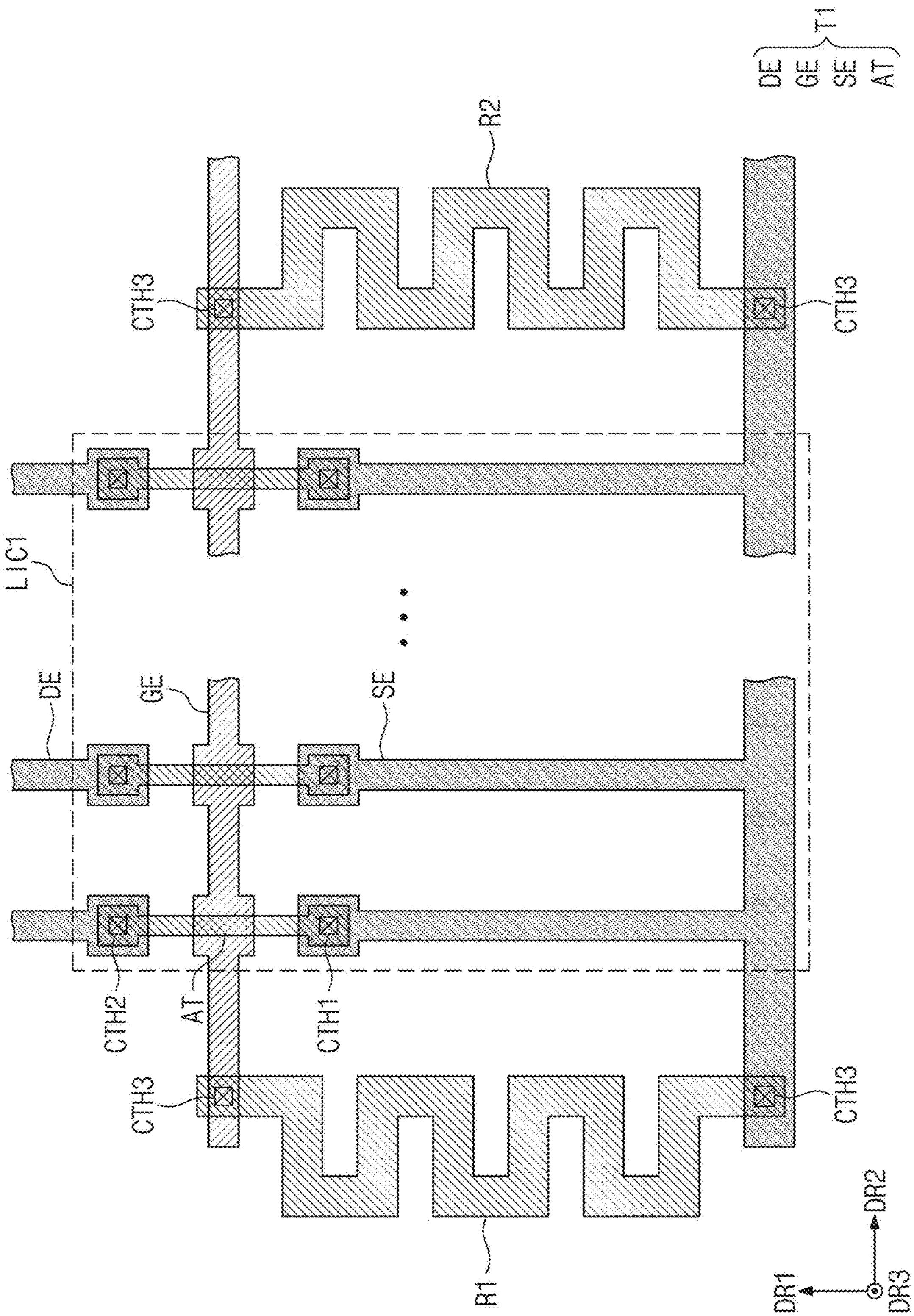
FIG. 9 is a diagram schematically illustrating a planar configuration of first transistors and first and second resistors shown in FIG. 8.

FIG. 9 is a diagram schematically illustrating a planar configuration of first transistors and first and second resistors shown in FIG. 8.

Referring to FIG. 9, each of the first transistors T1 may include a semiconductor layer AT, the gate electrode GE, the first electrode SE, and the second electrode DE. A stacked structure of the first transistors T1 may be substantially the same as the stacked structure of the transistor T shown in FIG. 6.

The semiconductor layer AT may correspond to the semiconductor layers S, A, and D shown in FIG. 6. The semiconductor layers AT of the first transistors T1 may extend to the first direction DR1 and may be arranged in the second direction DR2. The gate electrode GE may correspond to the gate electrode G shown in FIG. 6. The gate electrodes GE of the first transistors T1 may be integrally formed and may extend in the second direction DR2. When viewed from above a plane, the gate electrodes GE may extend to cross the semiconductor layers AT. An insulating layer may be interposed between the gate electrodes GE and the semiconductor layers AT.

The first electrode SE and the second electrode DE may correspond to the first connection electrode CNE1 shown in FIG. 6. The first electrode SE and the second electrode DE may be formed of the same material as the first connection electrode CNE1 to be spaced from each other in the first direction DR1.

The first electrodes SE of the first transistors T1 may be integrally formed to be connected to the semiconductor layers AT through first contact holes CTH1. The first contact holes CTH1 may be defined in an insulating layer between the first electrodes SE and the semiconductor layers AT.

The second electrodes DE of the first transistors T1 may be arranged in the second direction DR2, and may be respectively connected to the semiconductor layers AT through second contact holes CTH2. The second contact holes CTH2 may be defined in an insulating layer between the second electrodes DE and the semiconductor layers AT.

The first electrodes SE may be connected to ends of the semiconductor layers AT. The second electrodes DE may be connected to the other ends of the semiconductor layers AT. The gate electrodes GE may extend to cross the semiconductor layers AT between the first electrodes SE and the second electrodes DE.

The first resistor R1 and the second resistor R2 may be located on the same layer as the semiconductor layers AT and may be formed of the same material as the semiconductor layers AT. The first resistor R1 and the second resistor R2 may be connected to the gate electrodes GE and the first electrodes SE through third contact holes CTH3. The third contact holes CTH3 may be defined in an insulating layer between the first and second resistors R1 and R2 and the gate electrodes GE and an insulating layer between the first and second resistors R1 and R2 and the first electrodes SE.

Figure 10:
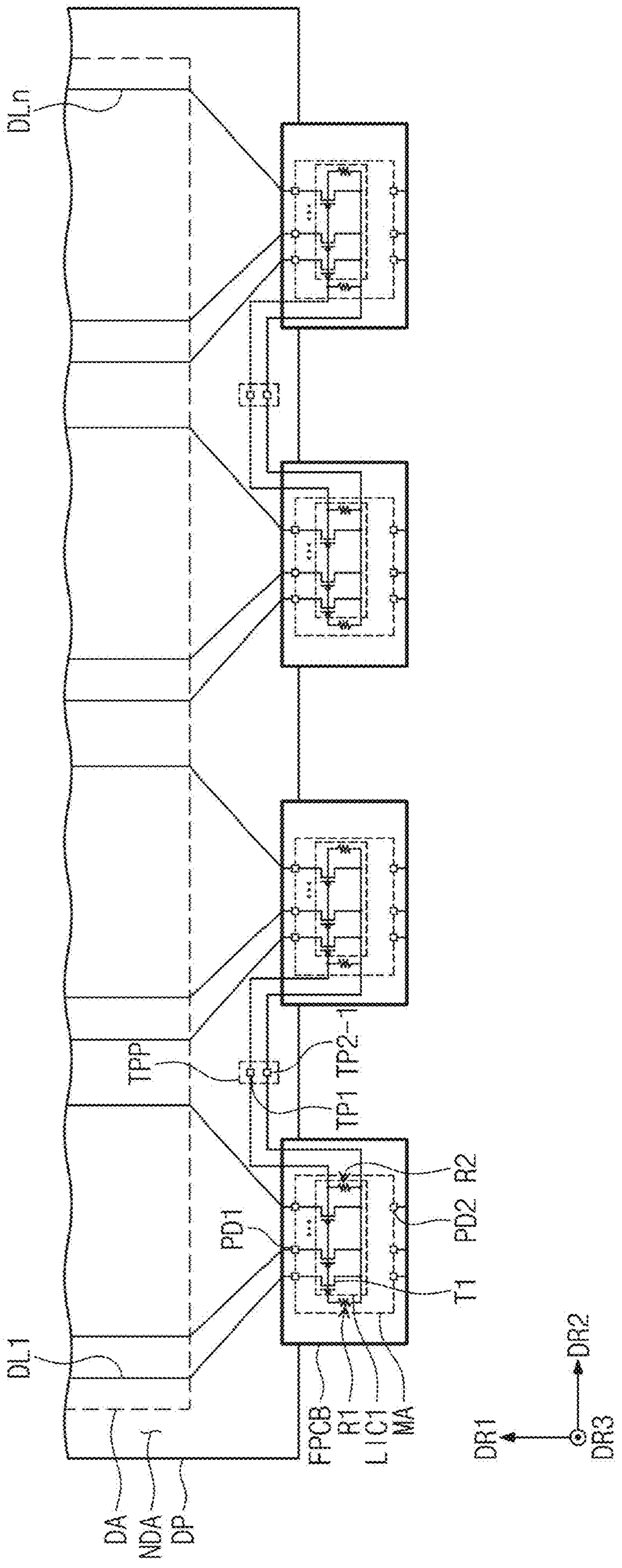
FIG. 10 is a view showing flexible printed circuit boards, on which the first lightning test circuits shown in FIG. 8 are located, in a plan view corresponding to FIGS. 7A and 7B.
Figure 11:
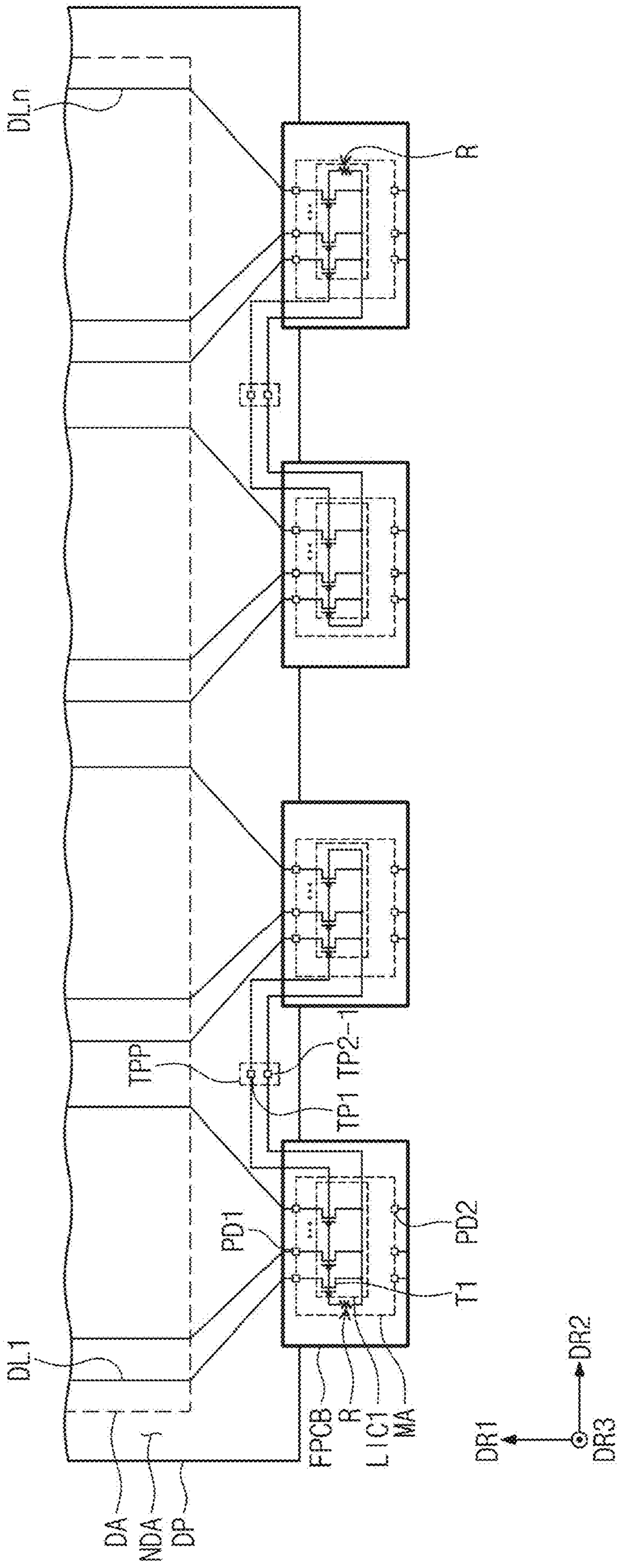
FIG. 11 is a diagram illustrating a configuration of a display device, according to a comparative embodiment.

For example, the first resistor R1 and the second resistor R2 may be symmetrical to each other and have substantially the same shape as each other, but shapes of the first resistor R1 and the second resistor R2 are not limited thereto. FIG. 10 is a view showing flexible printed circuit boards, on which the first lightning test circuits shown in FIG. 8 are located, in a plan view corresponding to FIGS. 7A and 7B. FIG. 11 is a diagram illustrating a configuration of a display device, according to a comparative embodiment.

For example, FIG. 11 is a plan view corresponding to FIG. 10.

To simplify drawings, FIG. 10 shows that the second and third lightning test circuits LIC2 and LIC3 are omitted, and the flexible printed circuit boards FPCB are closer to each other than in FIGS. 7A and 7B. Moreover, for convenience of description, the mounting areas MA are shown to be larger than those in FIGS. 7A and 7B, the first test pad TP1 and the second test pad TP2-1 are shown, and the second test pads TP2-2 and TP2-3 are omitted. The pixels PX are omitted in FIGS. 10 and 11.

Referring to FIG. 10, as described above, the first lightning test circuit LIC1 may be connected to the first pads PD1 and may not be connected to the second pads PD2. Accordingly, the first transistors T1 may be connected to the first pads PD1 and may not be connected to the second pads PD2.

The first resistors R1 and the second resistors R2 may be more adjacent to opposite sides of the flexible printed circuit boards FPCB than the first and second pads PD1 and PD2 and the first transistors T1. The opposite sides of the flexible printed circuit boards FPCB may be opposite to each other in the second direction DR2. Accordingly, the opposite sides of the flexible printed circuit boards FPCB may correspond to opposite sides of the first lightning test circuit LIC1, which are opposite to each other in the second direction DR2.

Referring to FIG. 11, compared to FIG. 10, FIG. 11, resistors R may be located only on leftmost and rightmost sides of the flexible printed circuit boards FPCB, respectively. In this case, during a lighting test, a part of the display panel DP corresponding to an area where the resistors R are located and another part of the display panel DP may emit light with different luminance. That is, because the resistors R are not uniformly arranged on the display panel DP, a difference in luminance of the display panel DP may occur.

Referring to FIG. 10, the first and second resistors R1 and R2 may be located on opposite sides of each of the flexible printed circuit boards FPCB. Accordingly, compared to FIG. 11, in FIG. 10, the first and second resistors R1 and R2 may be uniformly arranged on the display panel DP. In this case, during the lighting test, the difference in luminance of the display panel DP may not occur.

According to some embodiments of the present disclosure, resistors for preventing or reducing static electricity may be positioned adjacent to both sides of each of lightning test circuits. As resistors prevent or reduce static electricity, damage to transistors of lightning test circuits may be prevented or reduced. Moreover, because resistors are relatively uniformly placed on a display panel, a luminance difference of the display panel may be reduced during the lighting test of pixels.

While aspects of some embodiments of the present disclosure have been described with reference to embodiments thereof, it will be apparent to those of ordinary skill in the art that various changes and modifications may be made thereto without departing from the spirit and scope of the present disclosure as set forth in the following claims, and their equivalents.

What is claimed is:

1. A display device comprising:

a display panel including a pixel connected to a scan line and a data line;

a flexible printed circuit board connected to the display panel;

a lightning test circuit on the flexible printed circuit board and connected to the data line; and a plurality of resistors adjacent to opposite sides of the lightning test circuit and connected to the lightning test circuit, wherein the lightning test circuit includes a transistor including a gate electrode, a first electrode, and a second electrode, and the resistors are connected in parallel between the gate electrode and the first electrode, and connected in parallel between a first test pad and a second test pad.

2. The display device of claim 1, wherein the transistor includes a semiconductor layer, and the second electrode is connected to the data line, and wherein the resistors are connected to the gate electrode and the first electrode.

3. The display device of claim 2, wherein the resistors include a same material as the semiconductor layer.

4. The display device of claim 2, wherein the resistors are on a same layer as the semiconductor layer.

5. The display device of claim 2, wherein the pixel includes a plurality of pixels, the data line includes a plurality of data lines, and the transistor includes a plurality of transistors, and wherein the resistors are adjacent to the opposite sides of the lightning test circuit and commonly connected to gate electrodes of the plurality of transistors and first electrodes of the plurality of transistors.

6. The display device of claim 5, wherein the resistors include:

a first resistor adjacent to one side of the lightning test circuit and connected to the transistors; and a second resistor adjacent to the other side of the lightning test circuit and connected to the transistors.

7. The display device of claim 5, wherein the first test pad is connected to the gate electrodes of the transistors; and the second test pad is connected to the first electrodes of the transistors.

8. The display device of claim 7, wherein the first test pad and the second test pad are on the display panel.

9. The display device of claim 7, wherein the transistors are configured to receive a control signal through the first test pad and to receive a test signal through the second test pad.

10. The display device of claim 5, wherein the transistors are configured to be turned on during lighting tests of the plurality of pixels.

11. The display device of claim 5, wherein the transistors are configured to be turned off in a display mode in which the plurality of pixels display an image.

12. The display device of claim 1, wherein a resistor adjacent to a first side of the lightning test circuit and a resistor adjacent to a second side of the lightning test circuit opposite the first side have shapes symmetrical to each other.

13. The display device of claim 1, further comprising:

a first pad connected to the data line; and a second pad spaced from the first pad, wherein the lightning test circuit is connected to the first pad.

14. The display device of claim 13, wherein the lightning test circuit is not connected to the second pad.

15. The display device of claim 13, further comprising:

a data driver connected to the first pad and the second pad.

16. The display device of claim 13, wherein the resistors are more adjacent to opposite sides of the flexible printed circuit board than the first pad and the second pad, and wherein the opposite sides of the flexible printed circuit board correspond to the opposite sides of the lightning test circuit.

17. A display device comprising:

a display panel including a pixel connected to a scan line and a data line;

a flexible printed circuit board connected to the display panel;

a lightning test circuit on the flexible printed circuit board and including a transistor including a gate electrode, a first electrode, a semiconductor layer, and a second electrode connected to the data line;

a first resistor adjacent to one side of the lightning test circuit and connected to the gate electrode and the first electrode; and a second resistor adjacent to the other side of the lightning test circuit and connected to the gate electrode and the first electrode, wherein the first and second resistors are connected in parallel between a first test pad and a second test pad.

18. The display device of claim 17, wherein the first resistor and the second resistor include a same material as the semiconductor layer and are on a same layer as the semiconductor layer.

19. The display device of claim 17, wherein the first test pad is connected to the gate electrode of the transistor; and the second test pad is connected to the first electrode of the transistor, wherein the first test pad and the second test pad are on the display panel.

20. An electronic device comprising a display device for providing images:

wherein the display device comprises:

a display panel including a pixel connected to a scan line and a data line;

a flexible printed circuit board connected to the display panel;

a lightning test circuit on the flexible printed circuit board and connected to the data line; and a plurality of resistors adjacent to opposite sides of the lightning test circuit and connected to the lightning test circuit, wherein the lightning test circuit includes a transistor including a gate electrode, a first electrode, and a second electrode, and the resistors are connected in parallel between the gate electrode and the first electrode, and connected in parallel between a first test pad and a second test pad.

* * * * *